United States Patent
Shim et al.

(10) Patent No.: US 10,680,025 B2
(45) Date of Patent: Jun. 9, 2020

(54) SEMICONDUCTOR PACKAGE AND IMAGE SENSOR

(71) Applicant: Samsung Electronics Co., Ltd., Suwon-si, Gyeonggi-do (KR)

(72) Inventors: Jong Bo Shim, Asan-si (KR); Cha Jea Jo, Yongin-si (KR); Sang Uk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/952,449

(22) Filed: Apr. 13, 2018

(65) Prior Publication Data

US 2019/0103432 A1    Apr. 4, 2019

(30) Foreign Application Priority Data

Sep. 29, 2017    (KR) .......................... 10-2017-0127986

(51) Int. Cl.
*H01L 27/146*    (2006.01)
*H01L 23/00*    (2006.01)
*H01L 27/30*    (2006.01)

(52) U.S. Cl.
CPC ...... *H01L 27/14634* (2013.01); *H01L 23/562* (2013.01); *H01L 24/73* (2013.01); *H01L 27/1469* (2013.01); *H01L 27/14618* (2013.01); *H01L 27/14636* (2013.01); *H01L 27/307* (2013.01); *H01L 2224/73204* (2013.01); *H01L 2924/351* (2013.01)

(58) Field of Classification Search
CPC ......... H01L 27/14634; H01L 27/14618; H01L 27/1469
USPC ...................................................... 257/292
See application file for complete search history.

(56) References Cited

U.S. PATENT DOCUMENTS

| | | | |
|---|---|---|---|
| 5,972,735 A | 10/1999 | Dominic | |
| 6,331,446 B1 | 12/2001 | Cook et al. | |
| 9,165,961 B2 | 10/2015 | Iwama et al. | |
| 2014/0210027 A1 | 7/2014 | Cha et al. | |
| 2014/0374870 A1* | 12/2014 | Lee ................... | H01L 27/14618 257/466 |

FOREIGN PATENT DOCUMENTS

| | | |
|---|---|---|
| JP | 2015-220254 A | 12/2015 |
| KR | 10-0555860 B1 | 3/2006 |
| KR | 10-1204901 B1 | 11/2012 |
| KR | 10-2014-0147410 A | 12/2014 |
| KR | 10-1548821 B1 | 8/2015 |
| KR | 10-1597892 B1 | 2/2016 |
| KR | 10-2017-0004304 A | 1/2017 |

* cited by examiner

*Primary Examiner* — Bo Fan
(74) *Attorney, Agent, or Firm* — Sughrue Mion, PLLC

(57) ABSTRACT

A semiconductor package includes a package substrate, an image sensor disposed on the package substrate, and a bonding layer disposed between the package substrate and the image sensor, and including a first region and a second region, the second region has a modulus of elasticity lower than that of the first region and is disposed on a periphery of the first region.

19 Claims, 9 Drawing Sheets

SEMICONDUCTOR PACKAGE AND IMAGE SENSOR

CROSS-REFERENCE TO RELATED APPLICATION

This application claims benefit of priority to Korean Patent Application No. 10-2017-0127986 filed on Sep. 29, 2017 in the Korean Intellectual Property Office, the disclosure of which is incorporated herein by reference in its entirety.

FIELD

The present inventive concept relates to a semiconductor package and an image sensor.

BACKGROUND

An image sensor is a semiconductor-based sensor receiving light and generating an electrical signal, and may include a pixel array having a plurality of pixels and a circuit for driving the pixel array. Such an image sensor has been widely applied to a smartphone, a tablet PC, a laptop computer, a television, and the like, in addition to a camera for capturing still or moving images. Recently, research into various package technologies for effectively mounting an image sensor on a device such as a smartphone, a tablet PC, a laptop computer, or the like, as well as in a camera, has been actively conducted.

SUMMARY

An aspect of the present inventive concept may provide a semiconductor package effectively relieving stress applied to an image sensor.

According to an aspect of the present inventive concept, a semiconductor package includes a package substrate; an image sensor disposed on the package substrate; and a bonding layer disposed between the package substrate and the image sensor, wherein the bonding layer includes a first region, and a second region, wherein the second region has a modulus of elasticity lower than that of the first region, and wherein the second region is disposed on a periphery of the first region.

According to an aspect of the present inventive concept, a semiconductor package includes: a package substrate; an image sensor including a memory region, a logic circuit region stacked on the memory region, and a pixel array region stacked on the logic circuit region, wherein the memory region has a memory chip attached to the logic circuit region by a first chip bonding layer, and a dummy chip attached to the logic circuit region by a second chip bonding layer, wherein the second chip bonding layer having a modulus of elasticity different to that of the first chip bonding layer; and a bonding layer disposed between the package substrate and the image sensor, wherein the bonding layer attaches the package substrate and the image sensor to each other, and has a first region and a second region having different modulus of elasticity.

According to an aspect of the present inventive concept, an image sensor includes: a pixel array region having a plurality of pixels; a logic circuit region disposed below the pixel array region; a memory region disposed below the logic circuit region, wherein the memory region has a memory chip electrically connected to at least a portion of circuit elements included in the logic circuit region and a dummy chip disposed adjacent to the memory chip; and a chip bonding layer having a first chip bonding layer attaching the memory chip and the logic circuit region to each other, and a second chip bonding layer attaching the dummy chip and the logic circuit region to each other, wherein the second chip bonding layer has a modulus of elasticity lower than that of the first chip bonding layer.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
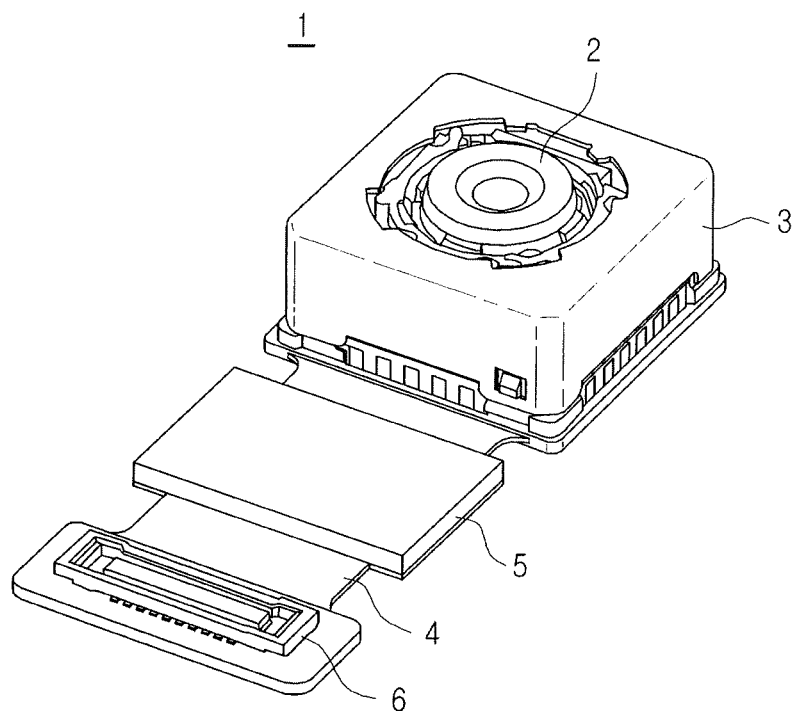
FIG. 1 is a perspective view illustrating a semiconductor package according to an example embodiment.

The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept.

In the specification, it will be understood that when an element is referred to as being "in contact with" or "on" another element, layer or region, it can be directly in contact with or on the other element, layer or region, or intervening elements, layers or regions may also be present. In the drawings, thicknesses of elements are exaggerated for clarity of illustration.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Also, though terms "first" and "second" may be used to describe various members, components, regions, layers, and/or portions in various embodiments of the inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of aspects of the present inventive concept explained and illustrated herein include their complementary counterparts. The same reference numerals or the same reference designators denote the same elements throughout the specification.

Hereinafter, example embodiments of the present inventive concept will be described with reference to the accompanying drawings.

FIG. 1 is a perspective view illustrating a semiconductor package according to an example embodiment.

Referring to FIG. 1, a semiconductor package 1 according to an example embodiment may include an image sensor capturing an image of a subject to generate image data. The semiconductor package 1 may include an optical portion 2, a housing 3 accommodating the optical portion 2, an image sensor, or the like, a circuit board 4 connected to an image sensor, an image processor 5, a connector 6, or the like. An outer cover of the semiconductor package 1 may be modified in a manner different from an example embodiment illustrated in FIG. 1.

The optical portion 2 may include at least one lens for collecting light for capturing an image of a subject. An image sensor may focus an image of a subject by moving a lens included in the optical portion 2, and a lens may be moved by an autofocusing (AF) actuator accommodated inside the housing 3.

An image sensor is disposed below the optical portion 2, and may be mounted on an upper portion of a package substrate connected to the circuit board 4. An image sensor may include a plurality of photoelectric devices, pixel circuits converting a charge in the plurality of photoelectric devices into an electrical signal, a logic circuit generating image data using the electrical signal generated by the pixel circuits, and the like. In an example embodiment, an image sensor may include a memory chip connected to a logic circuit and storing image data.

The image processor 5 may include an interface for communicating with other external devices, for example, an application processor (AP), a flash memory, or the like, an image signal processing unit, and the like. The image processor 5 may be mounted on the circuit board 4 and may be electrically connected to an image sensor inside the housing 3. In addition, the image processor 5 transmits and receives a signal with a central processing unit (CPU) or an external device such as an application processor (AP), a flash memory, a display driving device, or the like, through the connector 6.

Figure 2:
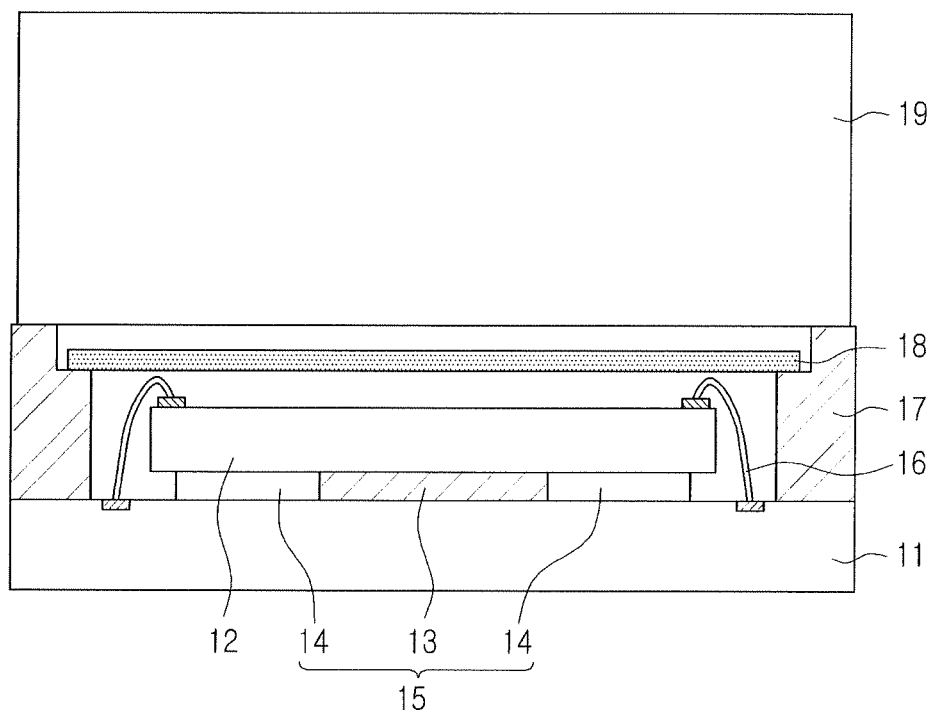
FIG. 2 is a cross-sectional view illustrating a semiconductor package according to an example embodiment.

FIG. 2 is a cross-sectional view illustrating a semiconductor package according to an example embodiment.

Referring to FIG. 2, a semiconductor package 10 according to an example embodiment may include a package substrate 11, an image sensor 12 provided on the package substrate 11, a bonding layer 15 allowing the image sensor 12 and the package substrate 11 to be attached to each other. The image sensor 12 may be electrically connected to circuit patterns provided in the package substrate 11 through a wire 16, and a holder 17 may be provided on a side surface of the image sensor 12. An infrared (IR) filter 18 and an optical portion 19 may be disposed in an upper portion of the holder 17.

Referring to FIG. 2, a space surrounded by the package substrate 11, the holder 17, and the IR filter 18 may be provided, and the image sensor 12 may be disposed in the space. The bonding layer 15 allowing the image sensor 12 to be attached to an upper surface of the package substrate 11 may include a first region 13 and a second region 14, formed of different materials.

In an example embodiment, the first region 13 and the second region 14 may have different moduli of elasticity. The concept used to compare a modulus of elasticity of the first region 13 with a modulus of elasticity of the second region 14 may be a Young's modulus, and may be a parameter indicating a degree to which an object is deformed along an axis when opposing forces are applied to the object on the axis. In an example embodiment, the first region 13 may have a modulus of elasticity relatively higher than that of the second region 14.

The first region 13 may be partially or completely surrounded by the second region 14. In other words, the second region 14 may be disposed on a periphery of the first region 13, so as to partially or completely surround, or to partially or completely encircle, the periphery of the first region 13. Thus, due to the first region 13 having a modulus of elasticity relatively higher than that of the second region 14, the image sensor 12 and the package substrate 11 may be securely fixed. Moreover, the second region 14 having a modulus of elasticity relatively lower than that of the first region 13, so stress, applied to the image sensor 12 due to impacts occurring in a process of assembling or using the semiconductor package 10, may be reduced.

An area, in which the bonding layer 15 is formed, may be smaller than an area of a lower surface of the image sensor 12. Coverage, indicating a ratio of an area of the bonding layer 15 to an area of a lower surface of the image sensor 12, may be about 70%. Meanwhile, the first region 13 and the second region 14 may be applied to an upper surface of the package substrate 11 or a lower surface of the image sensor 12 in a dispensing, dotting, or similar manner.

FIGS. 3 through 6 are views provided to illustrate a semiconductor package according to example embodiments. FIGS. 3 through 6 are views illustrating a bonding layer provided on a lower surface of an image sensor opposing a package substrate.

Figure 3:
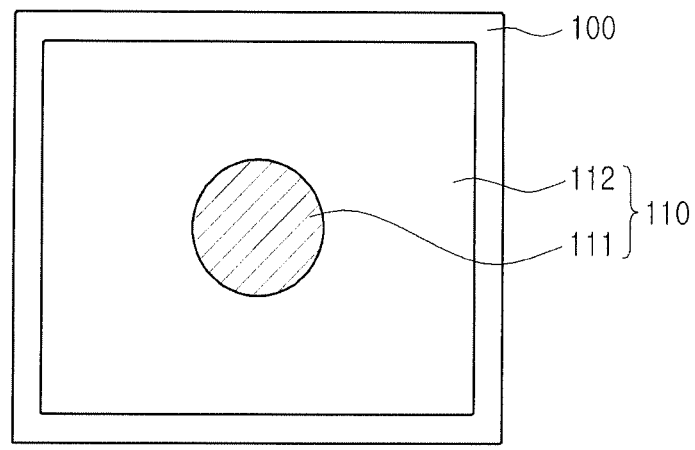
FIGS. 3 through 6 are views provided to illustrate a semiconductor package according to example embodiments.

First, referring to FIG. 3, a bonding layer 110 provided on a lower surface of an image sensor 100 may include a first region 111 and a second region 112. In an example embodiment illustrated in FIG. 3, the first region 111 may be provided in a central area of a lower surface of the image sensor 100, the second region 112 may be provided so as to completely surround the periphery of the first region 111, and the second region 112 may have a larger area than that of the first region 111. Although the first region 111 is depicted as being circular in shape, surrounded by the second region that is depicted as being rectangular in shape, the shapes of the first region 111 and second region 112 are not particularly limited thereto.

The first region 111 and the second region 112 may be formed of a material including an adhesive, or may be formed of an adhesive material, and first region 111 and second region 112 may be formed of different materials, for example, different adhesive materials. In an example embodiment, the material forming the first region 111 may have a higher modulus of elasticity than that of the material forming the second region 112. The second region 112 having a relatively lower modulus of elasticity is provided to completely surround the periphery of the first region 111, so stress transmitted to the image sensor 100 may be efficiently mitigated.

Figure 4:
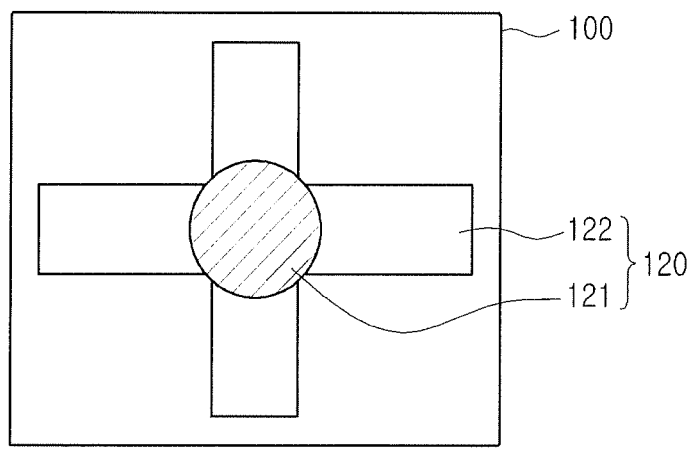

Next, referring to FIG. 4, a bonding layer 120 provided on a lower surface of the image sensor 100 may include a first region 121 and a second region 122. In an example embodiment illustrated in FIG. 4, the first region 111 may be provided in a central area of a lower surface of the image sensor 100. The second region 122 may include a plurality of subregions separated from each other by the first region 121, and may be disposed on the periphery of of the first region 121. The second region 122 may be disposed on the same layer as the first region 121, and the second region 122 may have a cross shape, but is not limited thereto. The plurality of subregions included in the second region 122 may be arranged symmetrically with respect to the first region 121. In addition, in an example embodiment illustrated in FIG. 4, the bonding layer 120 may not be formed between the plurality of subregions included in the second region 122.

Figure 5:
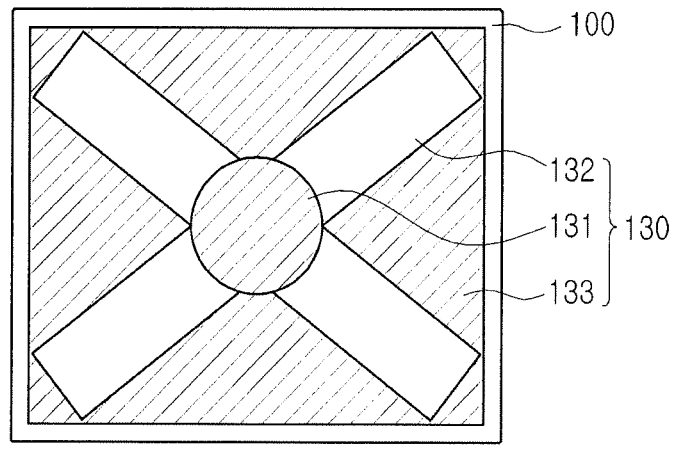

Referring to an example embodiment illustrated in FIG. 5, on a lower surface of the image sensor 100, a bonding layer 130 including a first region 131, a second region 132, and a third region 133 may be provided thereon. The first region 131 may be provided in a central area of a lower surface of the image sensor 100, and the second region 132 may have a plurality of subregions formed and arranged symmetrically on the periphery of the first region 131. In an example embodiment illustrated in FIG. 5, the plurality of subregions included in the second region 132 may be arranged in an X-shape. Meanwhile, a plurality of subregions included in the third region 133 may be disposed between and on the periphery of the plurality of subregions included in the second region 132.

At least a portion of the first region 131, the second region 132, and the third region 133 may be formed of materials having different moduli of elasticity. In an example embodiment, the second region 132 may be formed of a material having a lower modulus of elasticity than that of the first region 131 and the third region 133. In other words, the second region 132 may be formed of a softer adhesive material, i.e., is of a softer material as compared to a material of the first region 131 and the third region 133.

The first region 131 and the third region 133 may be formed of a harder adhesive material, i.e., is of a harder material as compared to a material of the second region 132. A modulus of elasticity of the first region 131 and a modulus of elasticity of the third region 133 may be the same or may be different. In an example embodiment, the modulus of elasticity of the first region 131 may be greater than the modulus of elasticity of the third region 133. The third region 133 may be formed to allow a portion of a lower surface of the image sensor 100 to be exposed externally. Thus, coverage of the bonding layer 130 to a lower surface of the image sensor 100 may be less than 100%.

Figure 6:
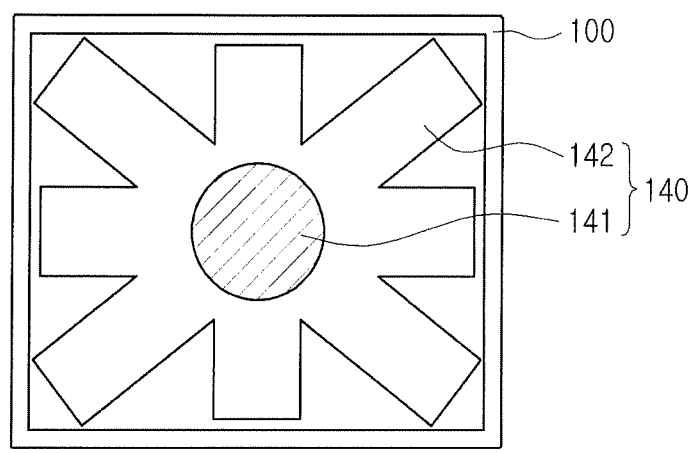

Referring to FIG. 6, a bonding layer 140 may include a first region 141 and a second region 142. The first region 141 may be provided in a central area of a lower surface of the image sensor, and the second region 142 may completely surround the periphery of the first region 141 and include multiple portions radiating outwards from the first region 141. The second region 142 may have a relatively larger area than that of the first region 141, and may be formed of a material having a relatively lower modulus of elasticity than that of the first region 141.

In example embodiments illustrated in FIGS. 3 through 6, second regions 112, 122, 132, and 142 may be disposed on the periphery of first regions 111, 121, 131, and 141. In other words, the second regions 112, 122, 132, and 142 may be disposed to be closer to an edge of a lower surface of the image sensor 100 as compared to the first regions 111, 121, 131, and 141. The image sensor 100 is firmly attached to a package substrate using the first regions 111, 121, 131, and 141, and the second regions 112, 122, 132, and 142 are provided in the vicinity thereof to relieve stress applied to the image sensor 100 during a manufacturing process or during use, so the image sensor 100 is prevented from being bent or inclined. In other words, the second regions 112, 122, 132, and 142 may function as a type a stress buffer layer. Meanwhile, in example embodiments illustrated in FIGS. 3 through 6, the bonding layers 110, 120, 130, and 140 may not only allow the image sensor 100 to be attached to a package substrate, but may also perform a function of transferring heat, generated during an operation of the image sensor 100, to a package substrate.

In example embodiments illustrated in FIGS. 3 through 6, the first regions 111, 121, 131, and 141 and the second regions 112, 122, 132, and 142 are depicted as being in direct contact with each other. However, a space may be provided between the first regions 111, 121, 131, and 141 and the second regions 112, 122, 132, and 142.

As described previously, the first regions 111, 121, 131, and 141 may be formed of a material, such as an adhesive or adhesive material, having a modulus of elasticity relatively higher than that of the second regions 112, 122, 132, and 142. In an example embodiment, the first regions 111, 121, 131, and 141 may be formed of an epoxy resin, and the second regions 112, 122, 132, and 142 may be formed of an epoxy silicone resin. Alternatively, the first regions 111, 121, 131, and 141, and the second regions 112, 122, 132, and 142, may be formed of an epoxy resin. In this case, the first regions 111, 121, 131, and 141 may be formed of a silver (Ag) epoxy, and the second regions 112, 122, 132, and 142 may be formed of a thermosetting epoxy.

Figure 7:
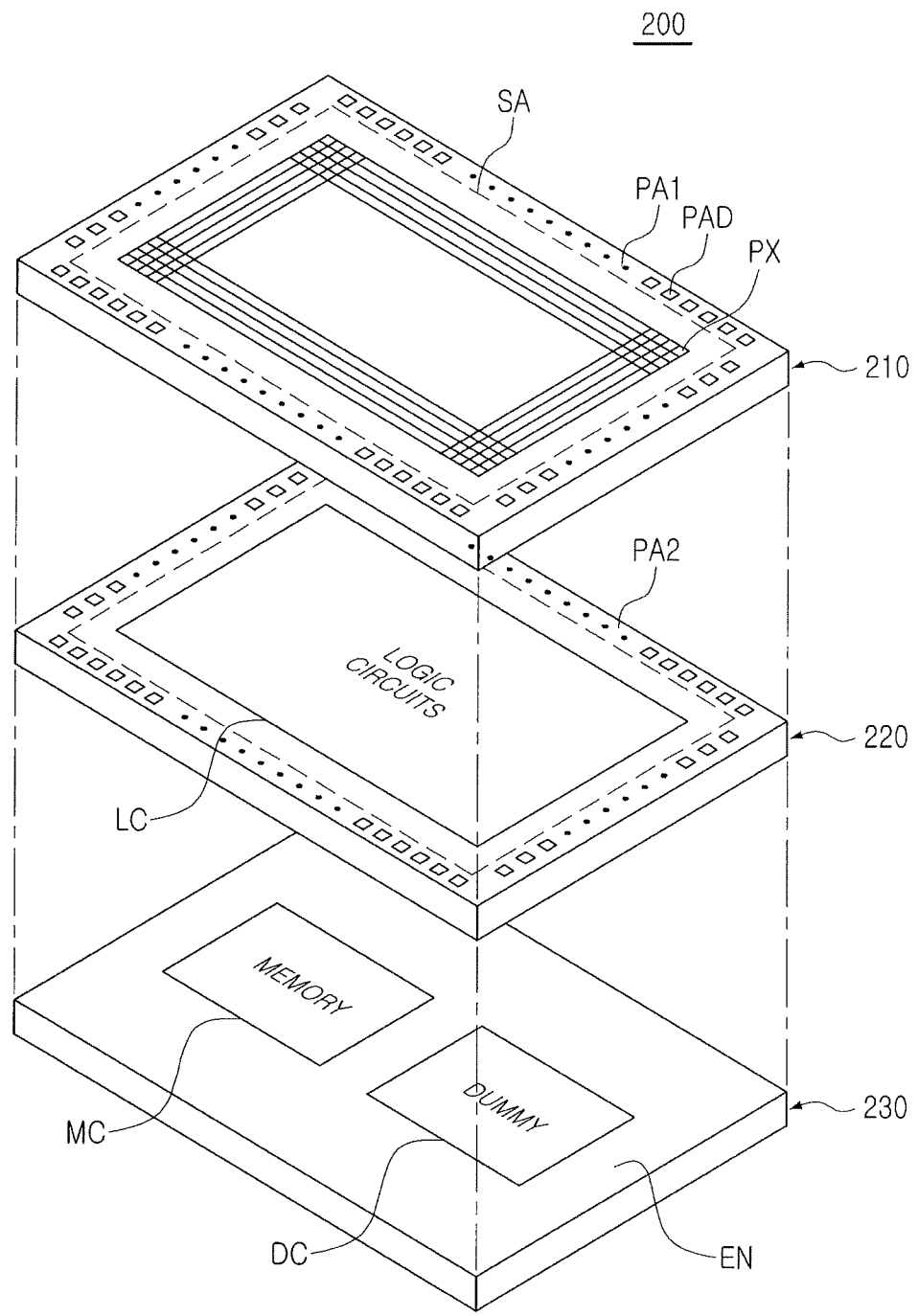
FIG. 7 is a perspective view schematically illustrating an image sensor according to an example embodiment.

FIG. 7 is a perspective view schematically illustrating an image sensor according to an example embodiment.

Referring to FIG. 7, an image sensor according to an example embodiment may include a pixel array region 210, a logic circuit region 220 provided below the pixel array region 210, a memory region 230 provided below the logic circuit region 220, and the like. The pixel array region 210, the logic circuit region 220, and the memory region 230 may be stacked on each other. In an example embodiment, the pixel array region 210 and the logic circuit region 220 may be stacked on a wafer level, and the memory region 230 may be attached to a lower portion of the logic circuit region 220 on a chip level.

The pixel array region 210 may include a sensing area SA in which a plurality of pixels PX are provided, and a first pad area PA1 provided on a periphery of the sensing area SA. A plurality of upper pads PAD are included in the first pad area PA1, and the plurality of upper pads PAD may be connected to a logic circuit LC and pads provided in a second pad area PA2 of the logic circuit region 220 through a via and the like.

Each of the plurality of pixels PX may include a photoelectric device receiving light and generating a charge, a pixel circuit converting the charge generated by the photoelectric device into an electrical signal, and the like. The photoelectric device may include an organic photodiode or a semiconductor photodiode, or the like. In an example embodiment, the organic photodiode and the semiconductor photodiode may be stacked on each other in each of the plurality of pixels PX. The pixel circuit may include a plurality of transistors converting the charge generated by the photoelectric device into an electrical signal.

The logic circuit region 220 may include a plurality of circuit elements formed in the logic circuit LC. The plurality of circuit elements included in the logic circuit LC may provide circuits for driving a pixel circuit provided in the pixel array region 210, for example, a row driver, column driver, a timing controller, and the like. The plurality of circuit elements included in the logic circuit LC may be connected to a pixel circuit through the first pad area PA1 and the second pad area PA2.

The memory region 230 provided below the logic circuit region 220 may include a memory chip MC, a dummy chip DC, and a protective layer EN sealing the memory chip MC and the dummy chip DC. The memory chip MC may be a dynamic random access memory (DRAM) or a static random access memory (SRAM), and the dummy chip DC may not have a function of actually storing data.

The memory chip MC may be electrically connected to at least a portion of circuit elements, included in the logic circuit region 220, by a bump. In an example embodiment, the bump may be a microbump. Between the memory chip MC and the logic circuit region 220, a first chip bonding layer, protecting the microbump and allowing the memory chip MC and the logic circuit region 220 to be stably attached to each other, may be provided.

Meanwhile, the dummy chip DC may not transmit and receive an electrical signal with the logic circuit region 220, and thus may be attached to the logic circuit region 220 without a bump. In an example embodiment, a second chip bonding layer, allowing the dummy chip DC to be attached to the logic circuit region 220, may be formed of a different material to the material of the first chip bonding layer. Hereinafter, this will be described in more detail with reference to FIG. 8.

Figure 8:
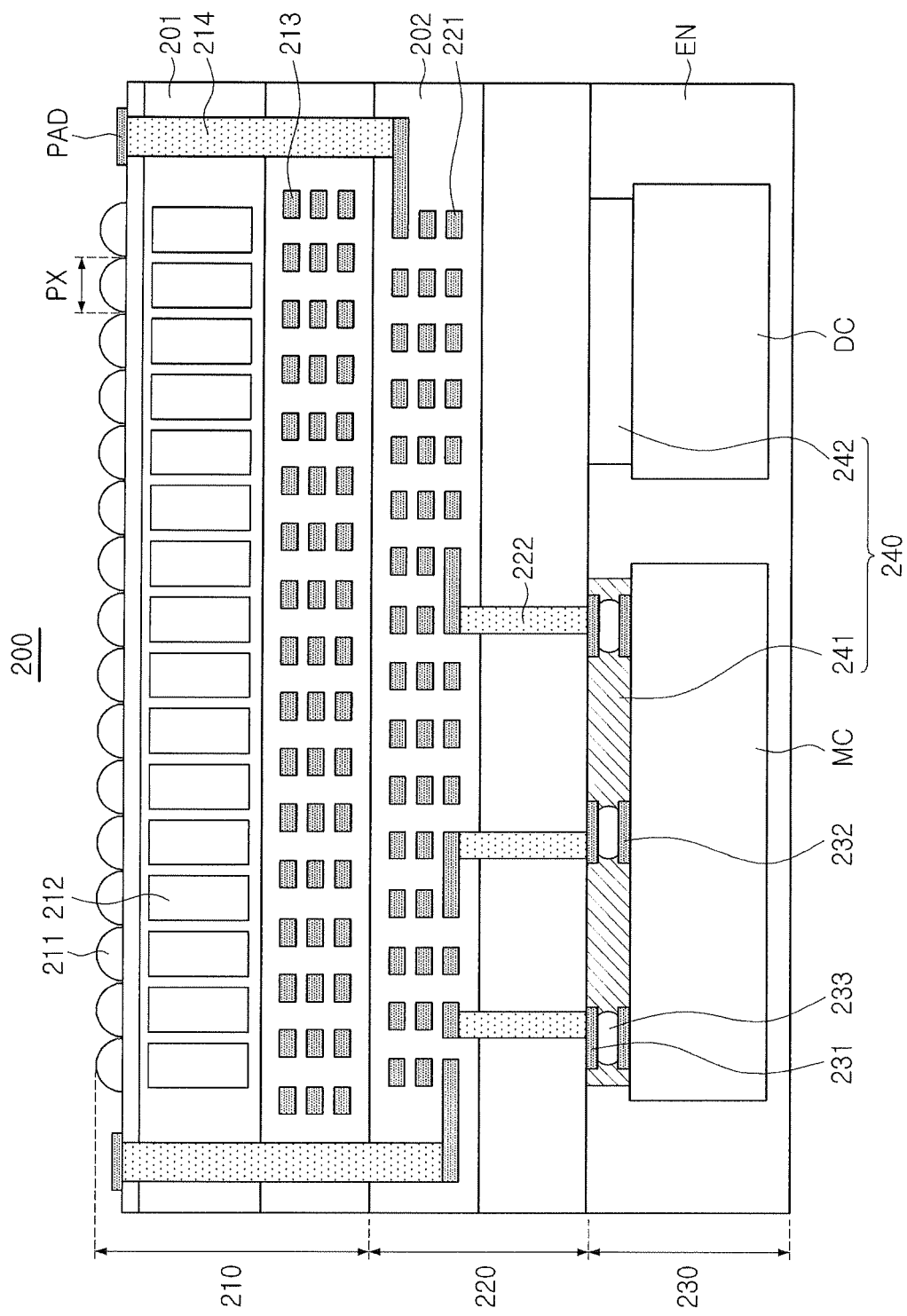
FIG. 8 is a cross-sectional view illustrating an image sensor according to an example embodiment.

FIG. 8 is a cross-sectional view illustrating an image sensor according to an example embodiment.

Referring to FIG. 8, an image sensor 200 according to an example embodiment may include a pixel array region 210, a logic circuit region 220, and a memory region 230. The pixel array region 210 may include a plurality of pixels PX. Each of the plurality of pixels PX may include a microlens 211, a photoelectric device 212, a pixel circuit 213, a first via 214, and the like.

The microlens 211 may collect light, transmitted from an outside, and may transmit the light to the photoelectric device 212. The photoelectric device 212 may be a semiconductor photodiode formed in a first semiconductor substrate 201, and may generate a charge from the light collected by the microlens 211. In an example embodiment, the photoelectric device 212 may further include an organic photodiode, in addition to a semiconductor photodiode, and the organic photodiode may be provided between the semiconductor photodiode and the microlens 211. Meanwhile, between the microlens 211 and the first semiconductor substrate 201, a buffer layer and layers for increasing light transmittance may be provided.

The charge generated by the photoelectric device 212 may be transferred to the pixel circuit 213. The pixel circuit 213 may include a plurality of transistors. For example, the pixel circuit may have a three-transistor (3T) or four-transistor (4T) structure. When the pixel circuit 213 has the 4T structure, the pixel circuit 213, connected to a single photoelectric device 212, may include a transfer transistor, a drive transistor, a reset transistor, a selection transistor, a floating diffusion node storing a charge, and the like.

The logic circuit region 220, provided below the pixel array region 210, may include a circuit for driving the pixel circuit 213, such as a row driver, a column driver, a timing controller, and the like. The logic circuit region 220 may include circuit elements 221 formed in a second semiconductor substrate 202, and at least a portion of the circuit elements 221 may be connected to an upper pad PAD through a first via 214. The upper pad PAD may be connected to circuit patterns, provided in a package substrate, through a wire, and the circuit elements 221 may transmit and receive a signal with an image processor through the upper pad PAD and the first via 214.

The memory region 230 is provided below the logic circuit region 220, and may include the memory chip MC capable of storing data, and the dummy chip DC. The memory chip MC may be connected to a lower portion of the logic circuit region 220 by an upper memory pad 231, a lower memory pad 232, and a microbump 233 provided therebetween. The upper memory pad 231 may be connected to at least a portion of the circuit elements 221, formed in the logic circuit region 220, by a second via 222.

Meanwhile, between each of the memory chip MC and the dummy chip DC and the logic circuit region 220, a first chip bonding layer 241 and a second chip bonding layer 242 may be provided. The first chip bonding layer 241 protects the microbump 233 while allowing the memory chip MC and the logic circuit region 220 to be further reliably combined with each other. The dummy chip DC is a chip which does not perform a separate function, and thus may be combined with a lower portion of the logic circuit region 220 using the second chip bonding layer 242 without a bump.

In an example embodiment, the first chip bonding layer 241 and the second chip bonding layer 242 may be formed of different materials. The first chip bonding layer 241 is a layer provided for stable connection of the memory chip MC required for an operation of the image sensor 200, and thus may be formed of a material having a modulus of elasticity relatively higher than that of the second chip bonding layer 242. For example, a material used for formation of the first chip bonding layer 241 has a modulus of elasticity of several GPa, while a material used for formation of the second chip bonding layer 242 may have a modulus of elasticity of several tens to hundreds of MPa.

In an example embodiment, the second chip bonding layer 242 is formed using a material having a relatively low modulus of elasticity, so stress applied to the image sensor 200 may be effectively mitigated by a force or heat. The dummy chip DC is a component, which is not involved in an actual operation of the image sensor 200, so a hard material having a high modulus of elasticity is not required to be used for combining the dummy chip DC with the logic circuit region 220. Thus, the second chip bonding layer 242 is formed using a soft material having a relatively low modulus of elasticity, so a stress buffering effect may be obtained.

Figure 9:
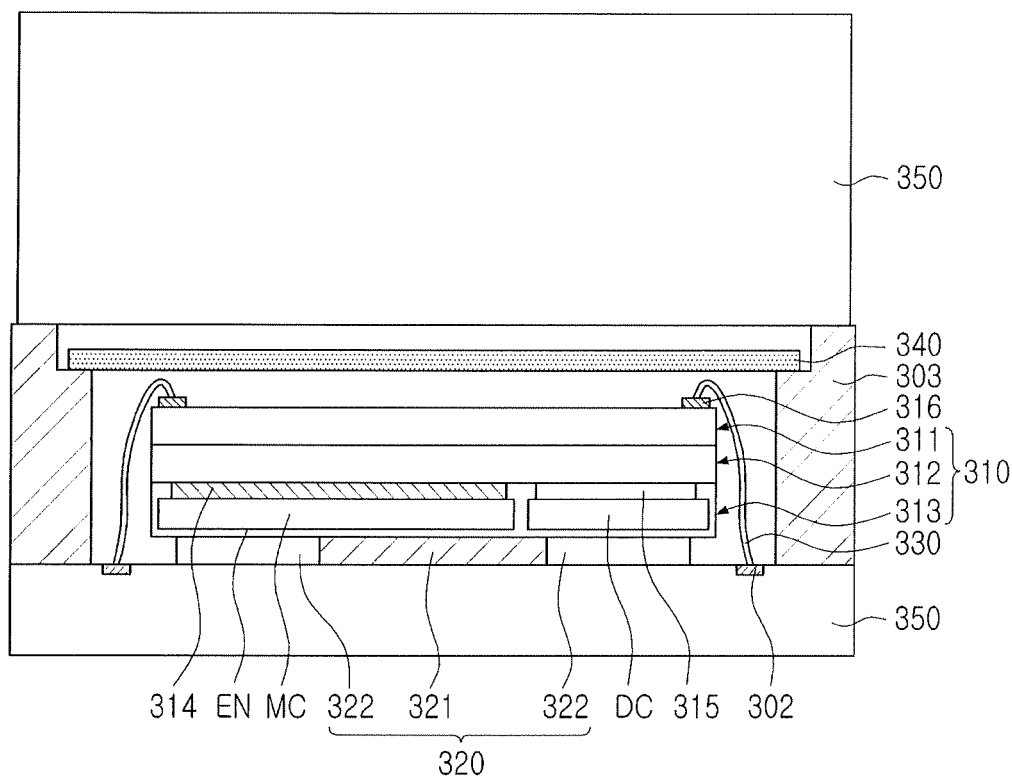
FIG. 9 is a cross-sectional view illustrating a semiconductor package according to an example embodiment.

FIG. 9 is a cross-sectional view illustrating a semiconductor package according to an example embodiment.

A semiconductor package 300 according to an example embodiment illustrated in FIG. 9 may include an image sensor 310 mounted on a package substrate 301, a bonding layer 320, a wire 330, an IR filter 340, an optical portion 350, and the like. A holder 303 defining a mounting space in which the image sensor 310 is provided may be provided on the package substrate 301, and the image sensor 310 may be attached to an upper surface of the package substrate 301 by the bonding layer 320.

The image sensor 310 may include a pixel array region 311, a logic circuit region 312, and a memory region 313. The pixel array region 311, the logic circuit region 312, and the memory region 313 may be stacked in a thickness direction. The memory region 313 may include the memory chip MC capable of storing image data, generated by the pixel array region 311 and the logic circuit region 312, as well as the dummy chip DC which does not have a data storage function. The memory chip MC and the dummy chip DC may be sealed by the protective layer EN.

An upper pad 316 may be provided on the pixel array region 311, and the upper pad 316 may be connected to a substrate pad 302, provided in the package substrate 301, through the wire 330. The substrate pad 302 may be electrically connected to a circuit pattern, an image processor, or the like in the package substrate 301. Thus, the pixel array region 311 and the logic circuit region 312 may transmit and receive a signal with an image processor, or the like through the wire 330.

The memory chip MC is attached to the logic circuit region 312 by a first chip bonding layer 314, and the dummy chip DC may be attached to the logic circuit region 312 by a second chip bonding layer 315. The first chip bonding layer 314 may have a higher modulus of elasticity than that of the second chip bonding layer 315. For example, the modulus of elasticity of the first chip bonding layer 314 may be several GPa.

The bonding layer 320, allowing the image sensor 310 to be combined with the package substrate 301, may include a first region 321 and a second region 322. The second region 322 may be provided on a periphery of the first region 321, and may be formed of a material having a lower modulus of elasticity than that of the first region 321. The image sensor 310 may be stably fixed to the package substrate 301 by the first region 321 having a high modulus of elasticity, and stress, which the image sensor 310 receives, may be relieved by the second region 322 having a low modulus of elasticity.

In an example embodiment, moduli of elasticity of the first region 321 and the second region 322, included in the bonding layer 320, may be lower than a modulus of elasticity of the first chip bonding layer 314. In an example embodiment, the first chip bonding layer 314 should perform a function of fixing the logic circuit region 312 and the memory chip MC while protecting a microbump allowing the logic circuit region 312 and the memory chip MC to be electrically connected to each other, and thus may have a higher modulus of elasticity than moduli of elasticity of the second chip bonding layer 315 and the bonding layer 320.

FIGS. 10 through 15 are views provided to illustrate a process of manufacturing a semiconductor package according to an example embodiment.

Figure 10:
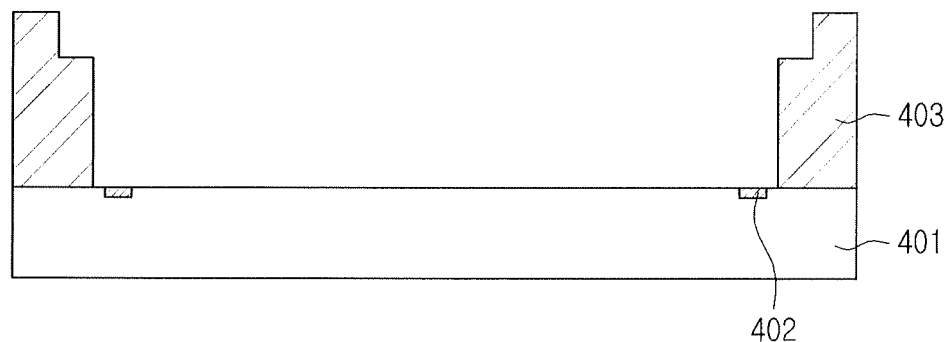
FIGS. 10 through 15 are views provided to illustrate a process of manufacturing a semiconductor package according to an example embodiment.

First, referring to FIG. 10, a holder 403 may be provided on a package substrate 401. The holder 403 may be formed of a polymeric insulating material such as a polyimide, or the like. A circuit pattern for electrical signal transmission may be formed on an upper surface of the package substrate 401 or in an interior of the package substrate 401, and the circuit pattern may be connected to a substrate pad 402 exposed to an upper surface of the package substrate 401.

Figure 11:
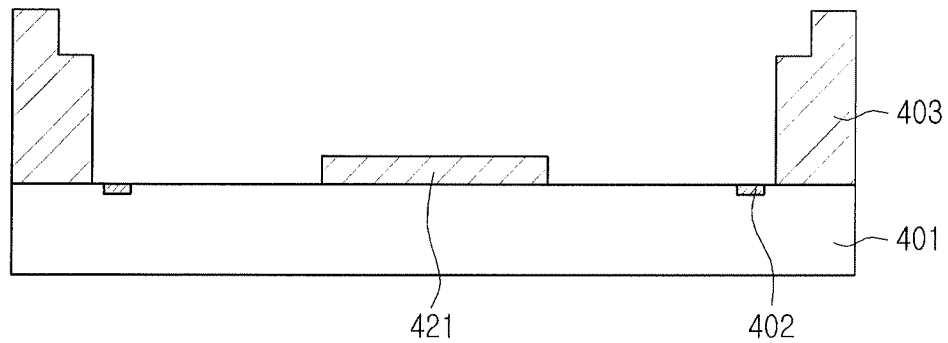

Referring to FIG. 11, a first region 421 of a bonding layer may be provided on a portion of an upper surface of the package substrate 401. The first region 421 may be formed of epoxy resin having a relatively high modulus of elasticity, and may be provided in the center of the upper surface of the package substrate 401. Next, referring to FIG. 12, a second region 422 is formed to on the periphery of the first region 421, so a bonding layer 420 may be formed. The second region 422 is formed to surround the first region 421, and may be formed over a larger area than the first region 421. In an example embodiment, the second region 422 may be formed of a material having a lower modulus of elasticity than that of the first region 421, for example, silicone resin.

Figure 12:
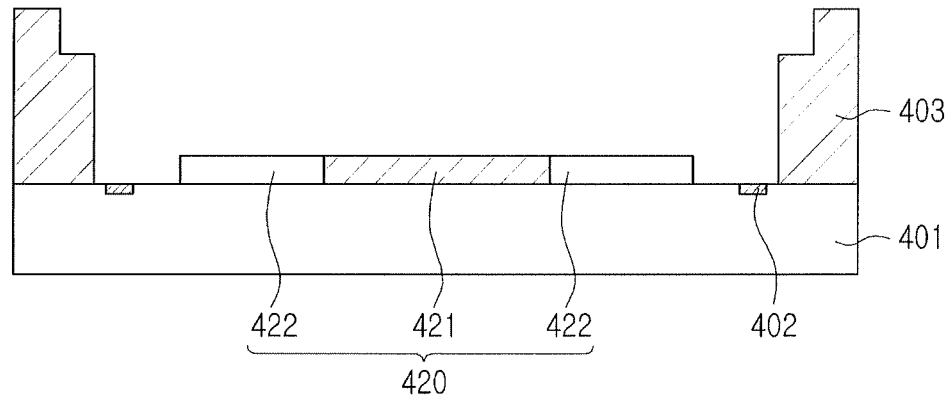

In an example embodiment illustrated in FIGS. 11 and 12, the first region 421 and the second region 422 are depicted as being in direct contact with each other. However, but a space may be provided between the first region 421 and the second region 422. The first region 421 and the second region 422 may be formed on an upper surface of the package substrate 401 using various methods such as dispensing, dotting, and the like.

Figure 13:
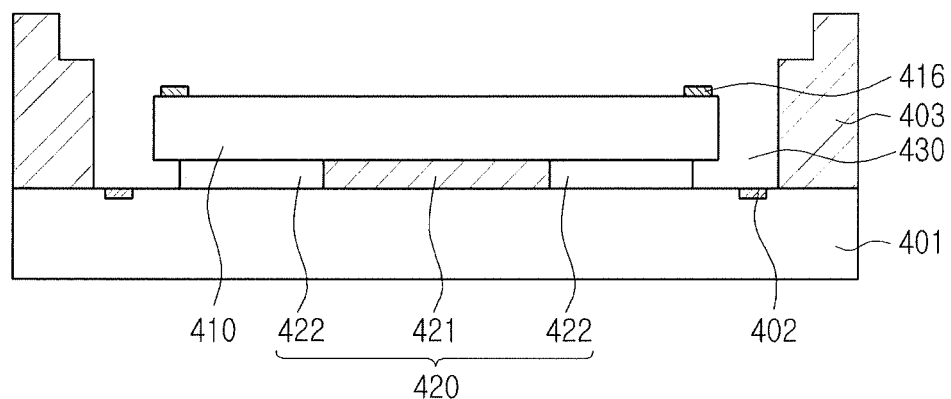

Referring to FIG. 13, an image sensor 410 may be attached to the bonding layer 420. In FIG. 13, the image sensor 410 is schematically illustrated, but the image sensor 410 may have a structure in which a pixel array region, a logic circuit region, a memory region, and the like are stacked. An upper pad 416 may be provided on an upper surface of the image sensor 410. Meanwhile, in a manner different from an example embodiment illustrated with reference to FIGS. 11 through 13, the bonding layer 420, including the first region 421 and the second region 422, is formed in a lower surface of the image sensor 410, and the image sensor 410 may be attached to the package substrate 401.

Figure 14:
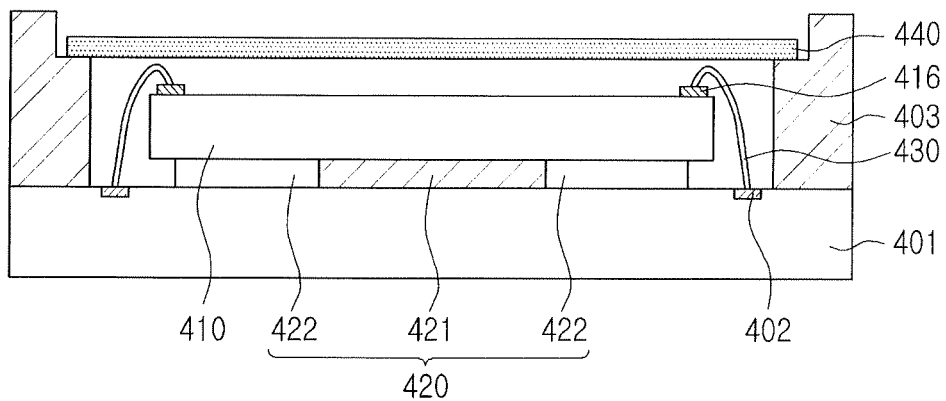

Next, referring to FIG. 14, after a wire 430 for connection of the upper pad 416 and the substrate pad 402 is formed, an IR filter 440 may be fixed to the holder 403. The IR filter 440 may be a filter for removing infrared rays from light coming from an external source so as to improve a performance of the image sensor 410. Meanwhile, the upper pad 416 and the substrate pad 402 are connected by the wire 430, so a control command, transmitted through a circuit pattern of the package substrate 401, may be transmitted to the image sensor 410, and image data, generated by the image sensor 410, may be transmitted to a central processing unit, an application processor, and/or a memory, or the like, through a circuit pattern of the package substrate 401.

Figure 15:
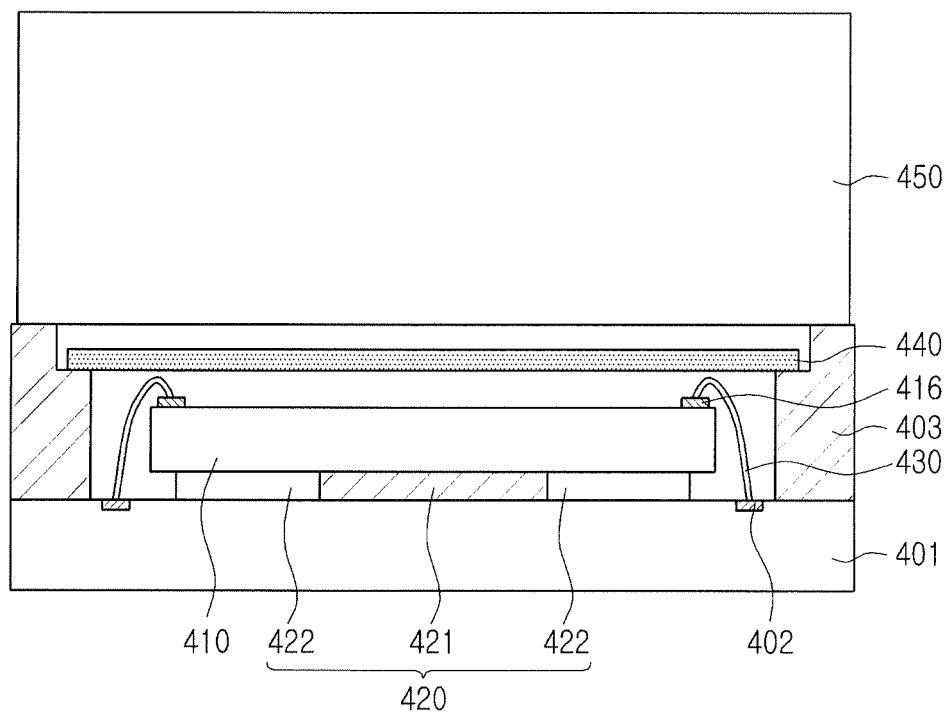

Referring to FIG. 15, an optical portion 450 may be attached to upper portions of the holder 403 and the IR filter 440. The optical portion 450 may include a plurality of lenses, and an AF actuator for focusing on a desired subject by moving the plurality of lenses may be provided separately.

Figure 16:
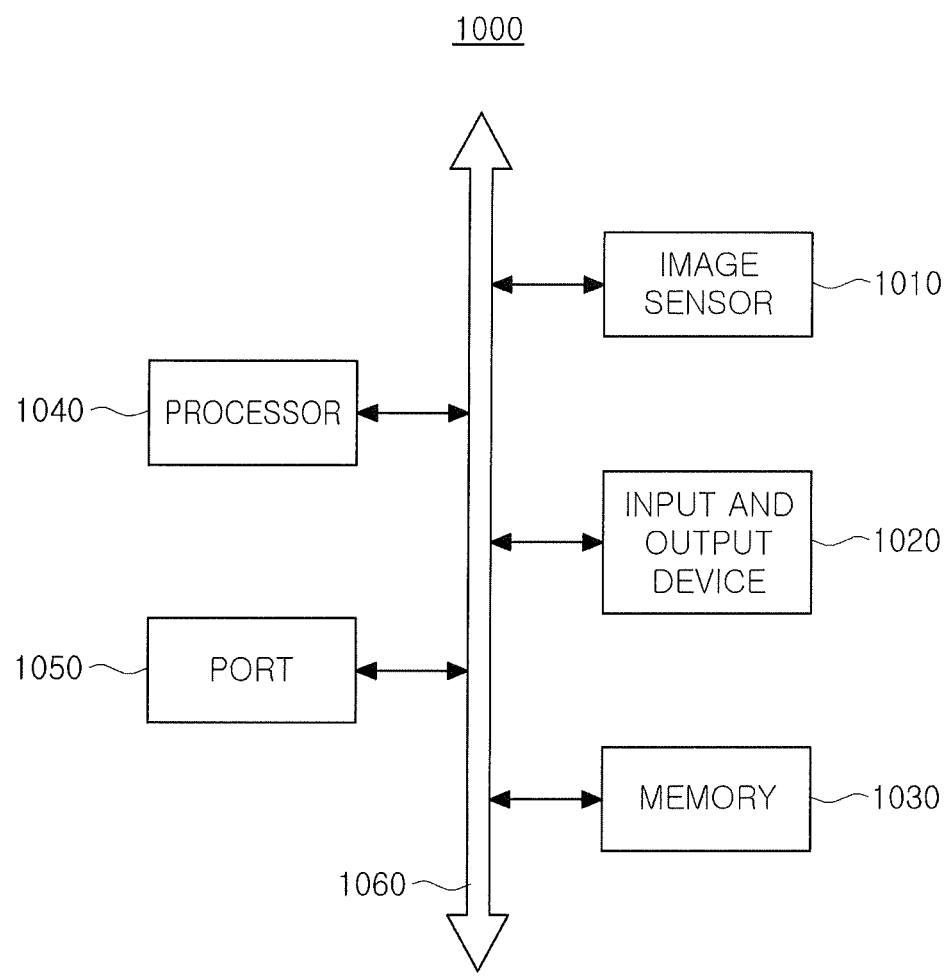
FIG. 16 is a block diagram illustrating an electronic device including a semiconductor package according to an example embodiment.

FIG. 16 is a block diagram illustrating an electronic device including a semiconductor package according to an example embodiment.

Referring to FIG. 16, an image sensor 1010 according to an example embodiment may be mounted on a package substrate and may be applied to a computer device 1000 while having a form of a semiconductor package. The computer device 1000 according to an example embodiment illustrated in FIG. 16 may include an input and output device 1020, a memory 1030, a processor 1040, a port 1050, and the like, in addition to the image sensor 1010. Furthermore, the computer device 1000 may further include a wired/wireless communication device, a power supply device, or the like. Among components illustrated in FIG. 16, the port 1050 may be a device provided to allow the computer device 1000 to communicate with a video card, a sound card, a memory card, a USB device, and the like. The computer device 1000 may be a concept covering all of a smartphone, a tablet PC, a smart wearable device, and the like, as well as a general desktop computer and a laptop computer.

The processor 1040 may perform a certain operation, a command, a task, or the like. The processor 1040 may be a central processing unit (CPU) or a microprocessor unit, and may communicate with other devices, connected to the memory 1030, the input and output device 1020, the image sensor 1010, and the port 1050, through a bus 1060.

The memory 1030 may be a storage medium storing data required for an operation of the computer device 1000, multimedia data, or the like. The memory 1030 may include a volatile memory such as a random access memory (RAM) or a non-volatile memory such as flash memory or the like. Moreover, the memory 1030 may include at least one among a solid state drive (SSD), a hard disk drive (HDD), and an optical disc drive (ODD), as a storage device. The input and output device 1020 may include an input device such as a keyboard, a mouse, a touch screen, or the like, as well as an output device such as a display, an audio output unit, and the like, provided to a user.

The image sensor 1010 is mounted on a package substrate and may be connected to the processor 1040 by the bus 1060 or other communications devices. The image sensor 1010 may be applied to the computer device 1000 while having a form according to various example embodiments, illustrated with reference to FIGS. 1 through 15.

As set forth above, according to example embodiments of the present inventive concept, a bonding layer between an image sensor and a package substrate may include a first region and a second region, having different moduli of elasticity. The second region having a relatively low modulus of elasticity is disposed on the periphery of of the first region, so stress which an image sensor receives due to impact applied to a semiconductor package may be significantly reduced.

While example embodiments have been shown and described above, it will be apparent to those skilled in the art that modifications and variations could be made without departing from the scope of the present disclosure, as defined by the appended claims.

What is claimed is:

1. A semiconductor package, comprising:
a package substrate;
an image sensor disposed on the package substrate; and
a bonding layer disposed between the package substrate and the image sensor,
wherein the bonding layer comprises a first region and a second region,
wherein the second region has a modulus of elasticity lower than that of the first region and is disposed on a periphery of the first region.

2. The semiconductor package of claim 1, wherein the second region comprises a plurality of subregions.

3. The semiconductor package of claim 2, wherein at least a portion of the plurality of subregions are separated from each other by the first region.

4. The semiconductor package of claim 2, wherein at least a portion of the plurality of subregions have a shape extended from the first region.

5. The semiconductor package of claim 2, wherein at least a portion of the plurality of subregions are symmetrically arranged with respect to the first region.

6. The semiconductor package of claim 1, wherein the bonding layer comprises a third region on a periphery of the second region.

7. The semiconductor package of claim 6, wherein the third region has a modulus of elasticity higher than that of the second region.

8. The semiconductor package of claim 6, wherein the third region has a modulus of elasticity lower than that of the first region.

9. The semiconductor package of claim 1, wherein an area of the first region is smaller than an area of the second region.

10. The semiconductor package of claim 1, wherein the first region comprises epoxy resin, and the second region comprises silicone resin.

11. The semiconductor package of claim 1, wherein the image sensor comprises a pixel array region, a logic circuit region provided below the pixel array region, and a memory region provided below the logic circuit region,
the memory region has a memory chip storing data and a dummy chip disposed adjacent to the memory chip.

12. The semiconductor package of claim 11, wherein the image sensor has a first chip bonding layer allowing the memory chip to be attached to a lower portion of the logic circuit region, and a second chip bonding layer allowing the dummy chip to be attached to the lower portion of the logic circuit region.

13. The semiconductor package of claim 12, wherein the first chip bonding layer has a modulus of elasticity higher than that of the second chip bonding layer.

14. A semiconductor package, comprising:
a package substrate;
an image sensor comprising a memory region, a logic circuit region stacked on the memory region, and a pixel array region stacked on the logic circuit region, wherein the memory region has a memory chip attached to the logic circuit region by a first chip bonding layer, and a dummy chip attached to the logic circuit region by a second chip bonding layer, wherein the second chip bonding layer has a modulus of elasticity different to that of the first chip bonding layer; and
a bonding layer disposed between the package substrate and the image sensor, wherein the bonding layer attaches the package substrate and the image sensor to each other, and wherein the bonding layer comprises a first region and a second region, wherein the first region has a different modulus of elasticity than that of the second region.

15. The semiconductor package of claim 14, wherein the first chip bonding layer has a modulus of elasticity higher than that of the second chip bonding layer.

16. The semiconductor package of claim 15, wherein the first chip bonding layer has a modulus of elasticity higher than those of the second chip bonding layer, the first region, and the second region.

17. The semiconductor package of claim 14, wherein the first region has a modulus of elasticity higher than that of the second region, and the second region is disposed on a periphery of the first region.

18. The semiconductor package of claim 14, wherein the image sensor comprises a microbump disposed between the memory chip and the logic circuit region, and wherein the first chip bonding layer protects the microbump.

19. An image sensor, comprising:

a pixel array region having a plurality of pixels;

a logic circuit region disposed below the pixel array region;

a memory region disposed below the logic circuit region, wherein the memory region has a memory chip electrically connected to at least a portion of circuit elements included in the logic circuit region and a dummy chip disposed adjacent to the memory chip; and a chip bonding layer comprising a first chip bonding layer attaching the memory chip and the logic circuit region to each other, and a second chip bonding layer attaching the dummy chip and the logic circuit region to each other, wherein the second chip bonding layer has a modulus of elasticity lower than that of the first chip bonding layer.

* * * * *